(12) United States Patent
Chen et al.

(10) Patent No.: US 10,234,905 B2
(45) Date of Patent: Mar. 19, 2019

(54) HINGE FOR FOLDABLE COMPONENTS

(71) Applicant: HEWLETT-PACKARD DEVELOPMENT COMPANY, L.P., Houston, TX (US)

(72) Inventors: Wei-Chung Chen, Taipei (TW);
Wei-Kuang Chu, Taipei (TW);
Chi-Hao Chang, Taipei (TW);
Kuan-Ting Wu, Taipei (TW);
Cheng-Feng Liao, Taipei (TW);
Charlie Ku, Taipei (TW); Kun Chih Wang, Houston, TX (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

(21) Appl. No.: 15/563,967

(22) PCT Filed: May 4, 2015

(86) PCT No.: PCT/US2015/028982
§ 371 (c)(1),
(2) Date: Oct. 3, 2017

(87) PCT Pub. No.: WO2016/178659
PCT Pub. Date: Nov. 10, 2016

(65) Prior Publication Data
US 2018/0136696 A1 May 17, 2018

(51) Int. Cl.
*G06F 1/16* (2006.01)
*H04M 1/02* (2006.01)

(52) U.S. Cl.
CPC .......... *G06F 1/1652* (2013.01); *G06F 1/1681* (2013.01); *H04M 1/022* (2013.01); *H04M 1/0216* (2013.01)

(58) Field of Classification Search
None
See application file for complete search history.

(56) References Cited

U.S. PATENT DOCUMENTS

| 6,532,147 | B1 | 3/2003 | Christ, Jr. |
| 7,142,415 | B2 | 11/2006 | Hillman et al. |

(Continued)

FOREIGN PATENT DOCUMENTS

| KR | 10-2011-0100936 A | 9/2011 |
| KR | 102011-0100936 A | 9/2011 |

(Continued)

OTHER PUBLICATIONS

"Samsung Reveals a New Display for a Future Smartphone that Could Fold in Half Like a Wallet"; Aug. 18, 2014; 8 pages.

*Primary Examiner* — Xanthia C Cunningham
(74) *Attorney, Agent, or Firm* — HPI Patent Department (57) ABSTRACT

Examples of a hinge for foldable components are described herein. In an example, the hinge can include a plurality of bracing elements, a bracing element from the plurality of bracing elements can be operably coupled to an adjacent bracing element from the plurality of bracing elements, to fold the plurality of bracing elements into an arcuate shape. Each bracing element can be supported and locked against the adjacent bracing element in the arcuate shape. The hinge can further include an end coupler at each longitudinal end of the hinge to couple the hinge to a flexible element.

14 Claims, 11 Drawing Sheets

(56) References Cited

U.S. PATENT DOCUMENTS

| | | | |
|---|---|---|---|
| 7,364,320 B2 | 4/2008 | Van et al. | |
| 7,563,038 B2 | 7/2009 | Hershenzon | |
| 8,125,759 B2 | 2/2012 | Fukuma et al. | |
| 8,186,781 B2* | 5/2012 | Coleman | E05D 3/022 16/354 |
| 8,385,055 B2* | 2/2013 | Kao | G06F 1/1652 349/56 |
| 9,064,431 B2* | 6/2015 | Ahn | G06F 1/1616 |
| 9,348,370 B2* | 5/2016 | Song | G06F 1/1681 |
| 9,506,279 B2* | 11/2016 | Kauhaniemi | G06F 1/1652 |
| 9,625,947 B2* | 4/2017 | Lee | G06F 1/1616 |
| 9,625,954 B2* | 4/2017 | Campbell | G06F 1/1681 |
| 9,851,759 B2* | 12/2017 | Tazbaz | G06F 1/1681 |
| 9,910,465 B2* | 3/2018 | Tazbaz | G06F 1/1681 |
| 2009/0241290 A1* | 10/2009 | Jones | B41J 3/4071 16/291 |
| 2010/0232100 A1* | 9/2010 | Fukuma | F16G 13/18 361/679.01 |
| 2010/0246113 A1 | 9/2010 | Visser et al. | |
| 2011/0000136 A1* | 1/2011 | Brun | E05D 3/06 49/358 |
| 2012/0120618 A1* | 5/2012 | Bohn | G06F 1/1618 361/749 |
| 2012/0307423 A1* | 12/2012 | Bohn | G06F 1/1641 361/679.01 |
| 2013/0070431 A1* | 3/2013 | Fukuma | G06F 1/1652 361/749 |
| 2013/0322004 A1* | 12/2013 | Park | F16C 11/10 361/679.27 |
| 2013/0335893 A1* | 12/2013 | Liang | G06F 1/1681 361/679.01 |
| 2013/0342090 A1 | 12/2013 | Ahn et al. | |
| 2014/0226275 A1* | 8/2014 | Ko | G06F 1/1626 361/679.27 |
| 2014/0245569 A1* | 9/2014 | Cho | E05D 3/122 16/370 |
| 2015/0077917 A1 | 3/2015 | Song | |
| 2015/0233162 A1* | 8/2015 | Lee | H04M 1/02 16/223 |
| 2015/0362956 A1* | 12/2015 | Tazbaz | G06F 1/1637 361/679.27 |
| 2015/0370287 A1* | 12/2015 | Ko | G06F 1/1626 361/749 |
| 2016/0085268 A1* | 3/2016 | Aurongzeb | G06F 1/1652 345/156 |
| 2016/0227645 A1* | 8/2016 | Hampton | G06F 1/1601 |

FOREIGN PATENT DOCUMENTS

| | | |
|---|---|---|
| KR | 10-1346146 B1 | 12/2013 |
| KR | 10-1452867 B1 | 10/2014 |
| KR | 101452867 B1 | 10/2014 |
| WO | WO-2013080191 | 6/2013 |

* cited by examiner

HINGE FOR FOLDABLE COMPONENTS

BACKGROUND

The fleeting pace at which consumer markets are evolving has heralded an era befitting the adage—small is beautiful. Consumer goods companies and manufacturers are directing resources towards building compact devices and gadgets to attract customers. In the efforts of building compact devices, various ways of scaling down sizes of devices have been devised. One such way is by providing the devices and gadgets to be foldable. For example, mobile phones, tablet personal computers, and laptop having foldable bodies and displays have been developed.

BRIEF DESCRIPTION OF FIGURES

The detailed description is described with reference to the accompanying figures. It should be noted that the description and figures are merely example of the present subject matter and are not meant to represent the subject matter itself.

DETAILED DESCRIPTION

Generally, in order to scale down sizes of devices, such as gadgets and gizmos, such devices are formed as being foldable. For such a device, a body of the device can be formed of a plurality of segments put together to provide foldability to the device. A foldable hinge may be used for coupling the segments of the device. In an example, the foldable hinge can be formed as having a pivoting member and two panels coupled to the pivoting member and rotatable with reference to each other. The panels can be coupled to the segments of the device and can provide for folding of the segments connected by the foldable hinge.

Further, during use, the device may have to be maintained in a certain position. For example, the device may have to be fully unfolded or partially unfolded during the use and be in that position for a user to operate the device. In order to provide such a functionality to the foldable hinge, the panels can be tightly mounted on the pivoting member. However, as the device is constantly handled and used, i.e., folded and unfolded, friction due to the tight fit between pivoting member and the panels may lead to wear of the pivoting member and the panels. As a result, with prolonged usage of the hinge on the device, moving parts of the hinge may loosen and the hinge may not function effectively.

The present subject matter describes a hinge for use in a foldable component. The foldable component can be, for example, a foldable display unit or a flexible screen assembly for use with an electronic device. The foldable component can include a flexible element, such as a flexible screen, coupled to and supported by the hinge. For example, the flexible element can have a folding edge along which the flexible element can be folded. In other words, the folding edge folds when the flexible element is folded. The hinge can be coupled to the flexible element to longitudinally extend along the folding edge of the flexible element. Further, the hinge can be bent and folded for folding the flexible element while using the foldable component. According to an aspect, the hinge is a durable component. In other words, even after prolonged folding and bending of the hinge, the hinge can operate reliably when used for operation along with the foldable component.

According to an example, the hinge can include a plurality of bracing elements and an end coupler at each longitudinal end of the hinge to couple the hinge to a foldable component. Each bracing element can be operably coupled to an adjacent bracing element. For example, each bracing element can be abutted against the adjacent bracing element. Further, the assembly of the bracing elements can be folded into an arcuate shape. When folded in the arcuate shape, each bracing element can be supported and locked against the adjacent bracing element.

According to an example, the bracing elements can be oval gears. In such a case, the hinge can include an elastic connector element longitudinally extending along the folding edge of the flexible element and having the end coupler at each longitudinal end to couple to ends of the folding edge. The elastic connector element can stretch and bend along its length when the hinge, or the foldable component, is folded. In an example, the elastic connector element can be formed as a single piece or as an assembly of a plurality of sub-elements. Further, the oval gears can be rotatably mounted along a length of the elastic connector element. For example, the oval gears can rotate about a fixed axis on the elastic connector element when the hinge is folded.

Each oval gear can abut against adjacent oval gears substantially at a minor axis in an unfolded condition of the hinge. For example, due to manufacturing tolerances, the oval gears may not align perfectly along or at the minor axes. On the other hand, in a considerably folded condition of the foldable component, the oval gears can abut at least substantially along their major axis. For instance, when the foldable component, and therefore, the hinge, is folded, the oval gears can rotate such that the major axes of the oval gears can be aligned to follow a curvature of the foldable component and the oval gears are aligned substantially along the major axes.

When the foldable component is folded, each oval gear can rotate about a fixed axis on the elastic connector element. The degree of rotation which can determine an extent of alignment of the major axes of the oval gears can be dependent on various factors, such as an extent of folding, size of the oval gears, and number of oval gears mounted on the elastic connector element. The minor axis of the oval gear can be along a minimum diameter of the oval gear and the major axis can be along a maximum diameter of the oval gear.

In the folded state, the oval gears being rigid in structure can bear the load due to folding instead of the elastic connector element bearing the load. Accordingly, the elastic connector element has to bear considerably low load due to folding. Hence, the elastic connector element of the hinge is not permanently stretched even after continuous, prolonged operation because considerable load due to bending folding is borne by the rigid oval gears. This provides durability to the hinge.

In another example, the bracing elements can be telescopic brackets. In said example, one telescopic bracket can be hinged to an adjacent telescopic bracket and telescopically arranged therewith. Each telescopic bracket can have a first edge and a second edge, the first edge having an insert extending along a central longitudinal axis of the telescopic bracket and the second edge having a cavity extending along the central longitudinal axis of the telescopic bracket. Further, in an assembled state, the first edge of one telescopic bracket can be hinged to and abut against the second edge of the adjacent bracket.

According to an aspect, the insert of one telescopic bracket can move inside the cavity of the adjacent telescopic bracket when the hinge is folded into the arcuate shape, and the insert can bear an interference fit with the cavity. Similar to as explained above, the assembly of the telescopic brackets can be aligned along the folding edge of the flexible element and folded for supporting the flexible element. The interference fit between the telescopic brackets can provide for a firm support for the flexible element, for instance, in the folded condition.

The above aspects are further described in the figures and associated description below. It should be noted that the description and figures merely illustrate the principles of the present subject matter. Therefore, various arrangements that encompass the principles of the present subject matter, although not explicitly described or shown herein, can be devised from the description and are included within its scope. Additionally, the word "coupled" is used throughout for clarity of the description and can include either a direct connection or an indirect connection.

Figure 1:
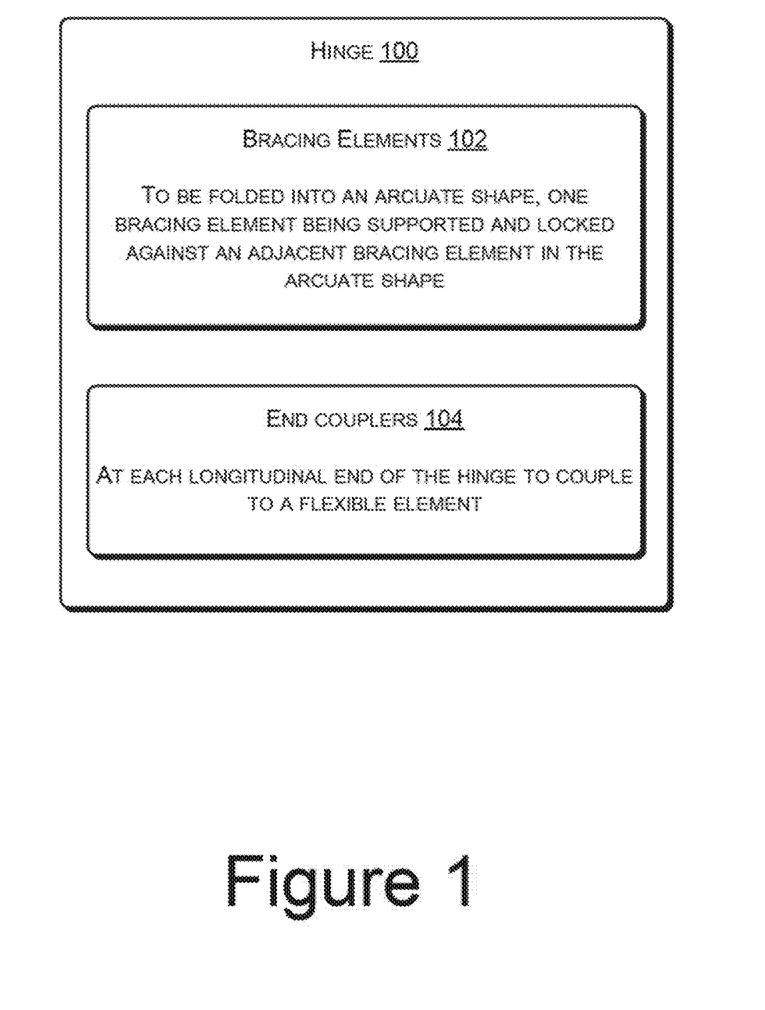
FIG. 1 illustrates a schematic of a hinge for a foldable component, according to an example of the present subject matter.

FIG. 1 illustrates a schematic of a hinge 100, according to an example of the present subject matter. In an example, the hinge 100 can be used in a foldable component (not shown) and bent for folding the foldable component. The hinge 100, in accordance with the present subject matter, is durable and can operate effectively even over prolonged usage. According to an example, the hinge 100 can include a plurality of bracing elements 102 and a plurality of end couplers 104. Each bracing element 102 from among the plurality of bracing elements 102 can be operably coupled to an adjacent bracing element 102 and can abut against the adjacent bracing element 102.

Further, an assembly of the bracing elements 102 can be folded into an arcuate shape. When folded in the arcuate shape, each bracing element 102 can be supported by and locked against the adjacent bracing element 102, to provide rigidity for maintaining the hinge in the folded condition. In addition, an end coupler 104 from among the plurality of end couplers 104 can be provided at each longitudinal end of the hinge 100 to fasten to a flexible element, such as a flexible screen, of the foldable component.

Figure 2:
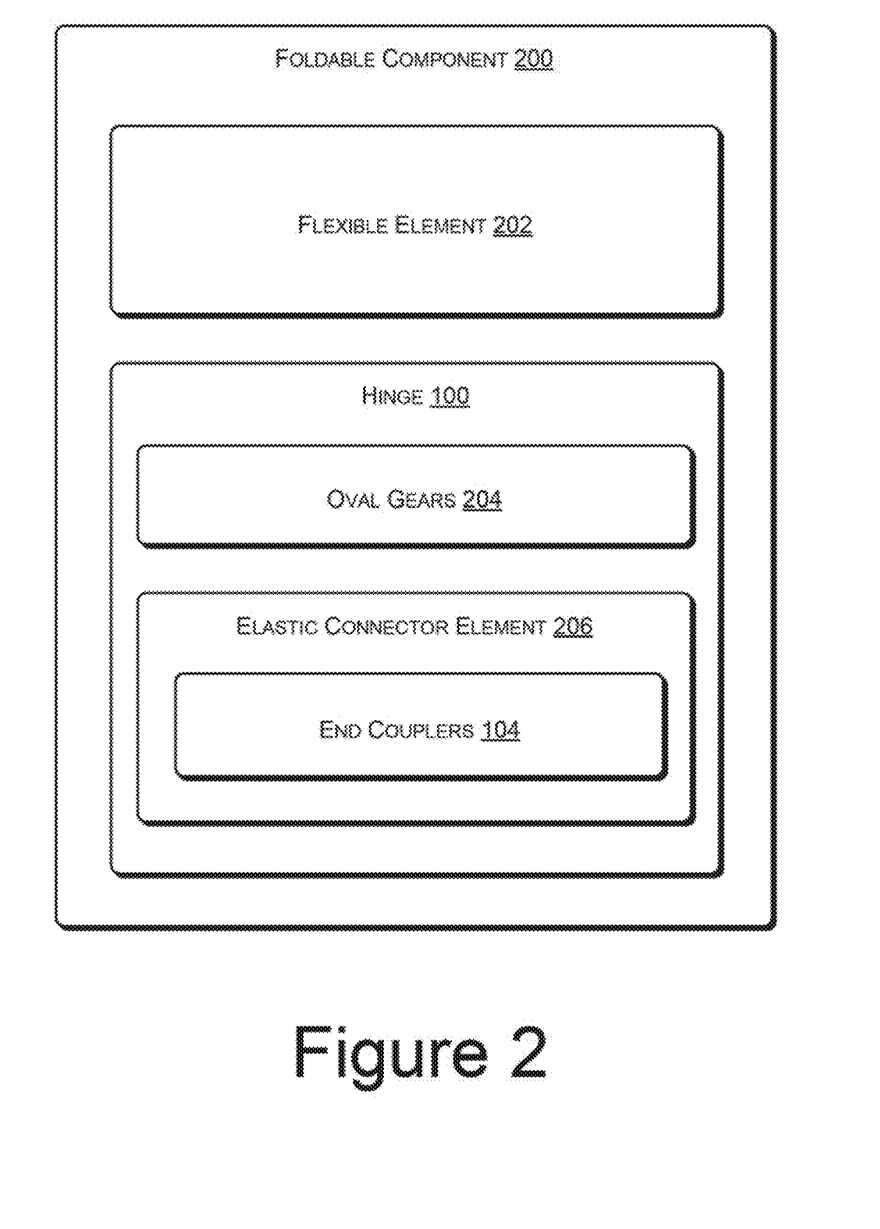
FIG. 2 illustrates a schematic of the foldable component, according to an example of the present subject matter.

FIG. 2 illustrates a schematic of a foldable component 200, in accordance with an example of the present subject matter. In said example, the foldable component 200 includes a flexible element 202 which is foldable. For instance, the flexible element 202 can have a folding edge along which the flexible element 202 can be folded. For instance, the flexible element 202 can be a flexible mirror, or a flexible display component, such as a flexible screen.

Further, the foldable component 200 can include the hinge 100 extending longitudinally along the folding edge of the flexible element. The hinge 100 can support the flexible element 202 and securely hold the flexible element 202, for instance, in a folded or an unfolded state. As mentioned previously, the hinge 100 can include the bracing elements 102 and the end couplers 104.

In said example, the bracing elements 102 can be gears. Accordingly, in said example, the hinge 100 can include a plurality of oval gears 204 and an elastic connector element 206 for mounting the oval gears 204. The elastic connector element 206 can longitudinally extend along the folding edge of the flexible element 202 and can have the end coupler 104 at each longitudinal end to couple to the ends of the folding edge, or in other words, the ends of the flexible element 202.

The oval gears 204 can be rotatably mounted on the elastic connector element 206 along a length of the elastic connector element 206. In the mounted state, each oval gear 204 can abut against an adjacent oval gear 204 and can be aligned along a minor axis in an unfolded condition of the hinge 100, and therefore, of the foldable component 200. In an example, when the oval gear 204 is abutted against the adjacent oval gears 204, teeth of the oval gears 204 can mesh together for providing an operable coupling between the oval gears 204

Figure 3A:
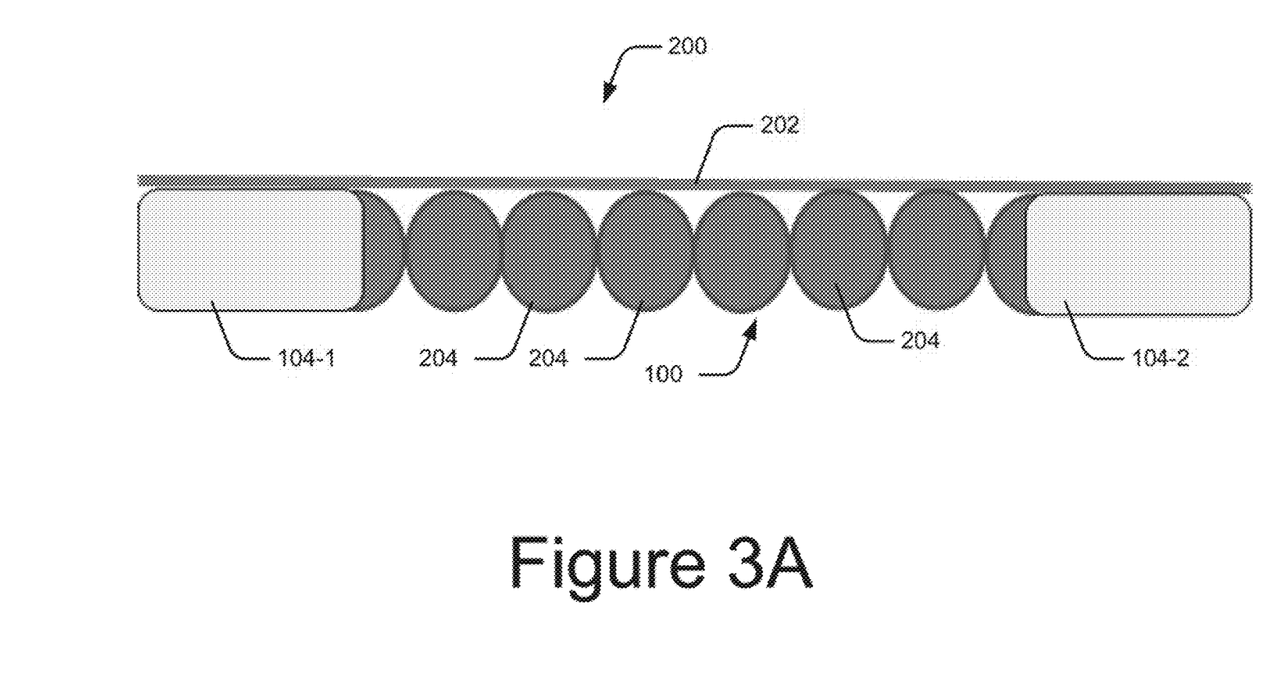
FIG. 3A illustrates the foldable component in an unfolded state, according to an example of the present subject matter.
Figure 3B:
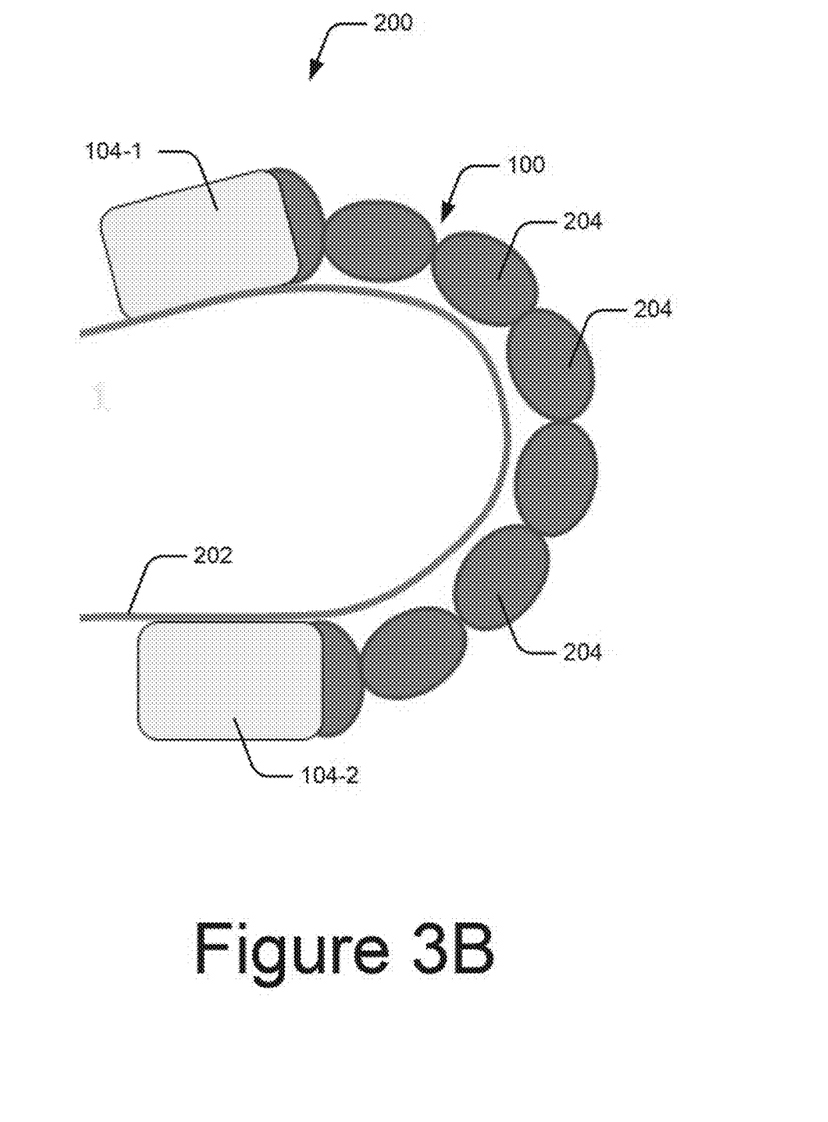
FIG. 3B illustrates the foldable component in a folded state, according to an example of the present subject matter.

FIG. 3A illustrates the foldable component 200 in an unfolded state, in accordance with an example of the present subject matter. Further, FIG. 3B illustrates the foldable component 200 in a folded state, in accordance with an example of the present subject matter. For the sake of brevity and ease of understanding, FIG. 3A and FIG. 3B are described in conjunction.

As shown, the end couplers 104-1 and 104-2, collectively referred to as the end couplers 104 and individually referred to as the end coupler 104, of the hinge 100 can be attached, fixedly or detachably, to the flexible element 202. For instance, the end coupler 104 can be coupled to the flexible element 202 using a fastener, such as a nut and bolt, a screw, a rivet, or using an adhesive, or a combination thereof.

Further, the hinge 100 can provide support to the flexible element 202 and provide rigidity for maintaining the flexible element 202 in a certain state, either folded or unfolded. In the unfolded state of the hinge, each oval gear 204 can abut against the adjacent oval gears 204 along the minor axes of the oval gears 204. When the hinge 100 is folded, as shown in FIG. 3B, the elastic connector element 206 (not shown) can bend and stretch along the length in accordance with a curvature of the foldable component 200.

Further, as the foldable component 200, and therefore, hinge 100, is folded along the folding edge, the extension in length of the elastic connector element 206 can result in provision of a space between the oval gears 204. In addition, upon folding of the foldable component 200, a force may act on the oval gears 204 making the oval gears 204 to rotate. For example, each of the oval gears 204 can be spring loaded, for instance, using torsion springs, such that when the space is formed between the oval gears 204, the oval gears 204 rotate to be aligned at least substantially along the major axes. For instance, the major axes of the oval gears can align along the curvature of the foldable component 200.

As mentioned above, the oval gears can rotate about their centers fixed to the elastic connector element 206.

Consider an example in which the foldable component 200 is folded from being at 180° to 90°, i.e., from the folding edge being straight to being folded in an L-shape. In such a case, the oval gears 204 along a straight portion of the L-shape may rotate so that the major axes of such oval gears 204 are aligned in a straight line. On the other hand, the two oval gears 204 at the curve of the L-shape can rotate in such a way that the major axes of the two oval gears 204 can align at about 90°.

In the folded condition of the hinge 100, the oval gears 204 being rigid in constitution can bear a load due to bending, instead of the elastic connector element 206 bearing the load. In one example, the oval gears 204 can comprise a ceramic material, a polymer, a metal, a metal alloy, or a combination thereof. Further, in an example, an abutting surface of each of the oval gears 204, i.e., surface at which one oval gear 204 abuts against the adjacent oval gears 204, can be treated with surface hardening processes, or in other words, can be surface treated to harden the abutting surface. For instance, in case the oval gears 204 are comprised of a metal or a metal alloy, the abutting surface of each oval gear 204 can be hardened by case hardening. In another example, the abutting surface of each oval gear 204 can be coated with a hard coating, using techniques, such as physical vapor deposition (PVD), chemical vapor deposition (CVD), and spray coating. For instance, the hard coating can be comprise boron nitride, titanium nitride (TiN), aluminum nitride, chromium nitride (CrN), aluminum titanium nitride (AlTiN), titanium aluminum nitride (TiAlN), titanium cyanide (TiCN), TiAlSiN, and carbon exhibiting properties similar to diamond.

In addition, each oval gear 204 can be mounted on the elastic connector element 206 as bearing an interference fit with a mounting portion of the elastic connector element 206 at which the oval gear 204 is mounted. As a result, in the folded condition as well as in the unfolded condition, the oval gears 204 can provide stiffness to the hinge 100 for maintaining the hinge 100 in a folded as well as unfolded condition. In addition, the elastic connector element 206 can further assist in providing stiffness to the hinge 100 in maintaining the hinge 100, when the hinge 100 in either the folded or the unfolded condition.

In an example, the elastic connector element 206 can comprise a polymer, a ceramic material, natural rubber, or a combination thereof. For instance, the polymer can be a silicon-based polymer, a cellulose-based polymer, a polycarbonate (PC), a polyester (PET), a polyethersulfone (PES), a polyimide (PI), a polynorbonene, a polyarylate, a polyurethane, a liquid-crystal polymer, an elastomer, or a combination thereof.

Figure 4A:
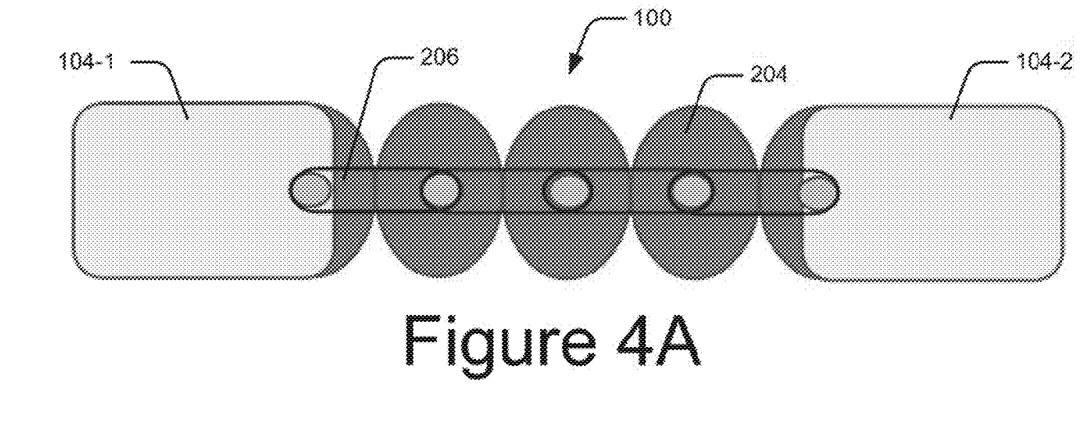
FIGS. 4A and 4B illustrate the hinge, according to an example of the present subject matter.
Figure 4B:
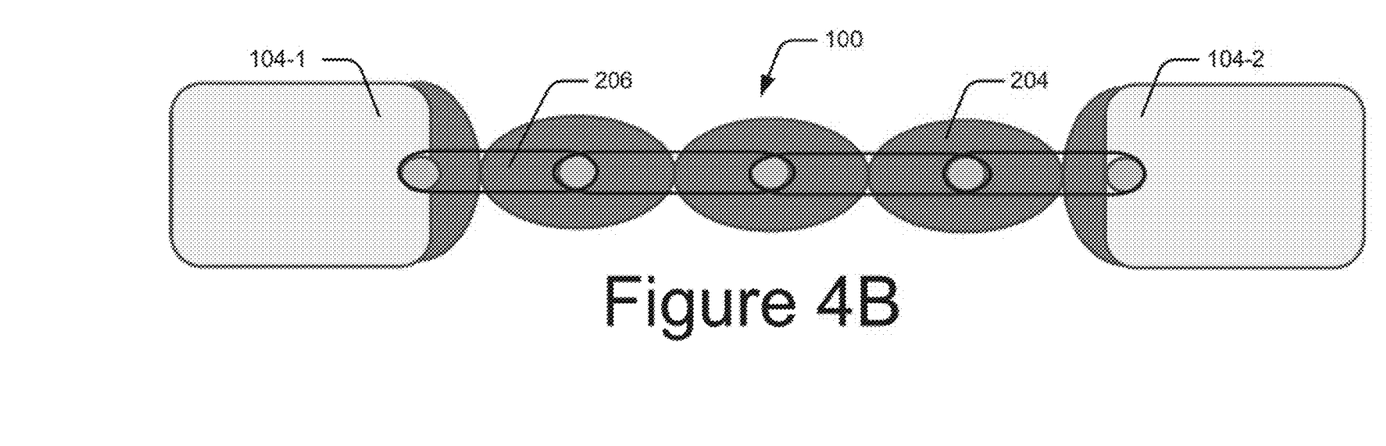

Further, the elastic connector element 206 can be formed as a single piece or can be formed as an assembly of a plurality of sub-elements. Various examples of the elastic connector element 206, amongst other things, are described with reference to FIGS. 4A and 4B, FIGS. 5A and 5B, FIGS. 6A and 6B, and FIGS. 7A and 7B. While, FIGS. 4A and 4B illustrate an example in which the elastic connector element 206 is formed as a single piece, FIGS. 5A and 5B, FIGS. 6A and 6B, and FIGS. 7A and 7B illustrate examples in which the elastic connector element 206 can be formed as an assembly of parts. In addition, FIGS. 4A and 4B, FIGS. 5A and 5B, FIGS. 6A and 6B, and FIGS. 7A and 7B illustrate, in general, a principle of operation of the hinge 100, in accordance with the present subject matter.

FIG. 4A and FIG. 4B illustrate the hinge 100 for the foldable component 200, according to an example of the present subject matter. As shown, FIG. 4A illustrates the hinge 100 with the elastic connector element 206 in an unstretched state and FIG. 4B illustrates the hinge 100 with the elastic connector element 206 in a stretched state.

In the example shown in FIG. 4A and FIG. 4B, the elastic connector element 206 can be formed as a single piece. In such an example, the elastic connector element 206 can comprise an elastic material. For instance, the elastic connector element 206 can comprise natural or synthetic rubber, such that the elastic connector element 206 can be stretched for folding the hinge 100, as shown in FIG. 4B, without being damaged.

In addition, as shown in FIG. 4A, in an unfolded state of the hinge 100, the elastic connector element 206 can be in the unstretched state. In such a state, the oval gears 204 can be aligned along the minor axes. Further, when the elastic connector element 206 is stretched, as shown in FIG. 4B, similar to the state of the elastic connector element 206 when the hinge 100 is folded, the gap between the oval gears 204 is formed and the oval gears 204 can rotate to align at least substantially along the major axes. While in FIG. 4B the oval gears 204 are shown to be fully aligned along the major axes, during folding of the hinge, the major axes may align partly or completely along the major axes. For example, during folding, the major axes align along the curvature of the flexible element 202.

Figure 5A:
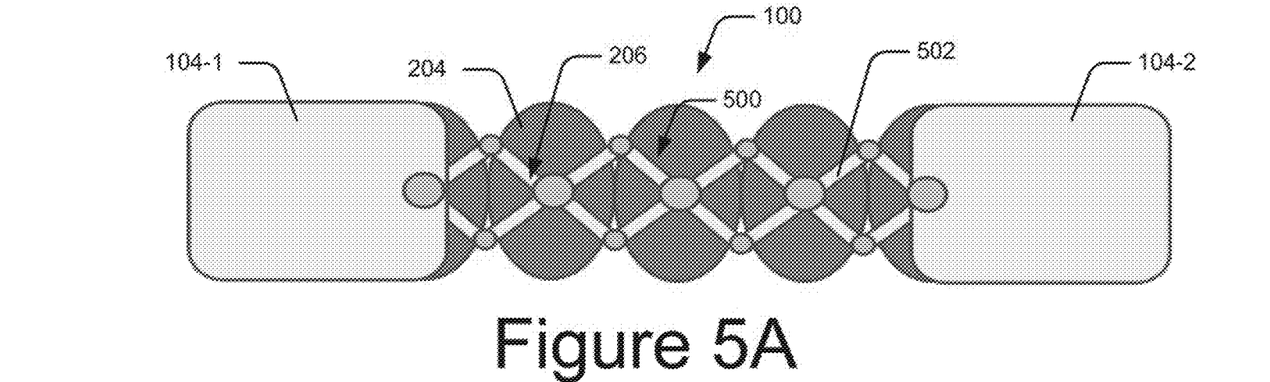
FIGS. 5A and 5B illustrate the hinge, according to another example of the present subject matter.
Figure 5B:
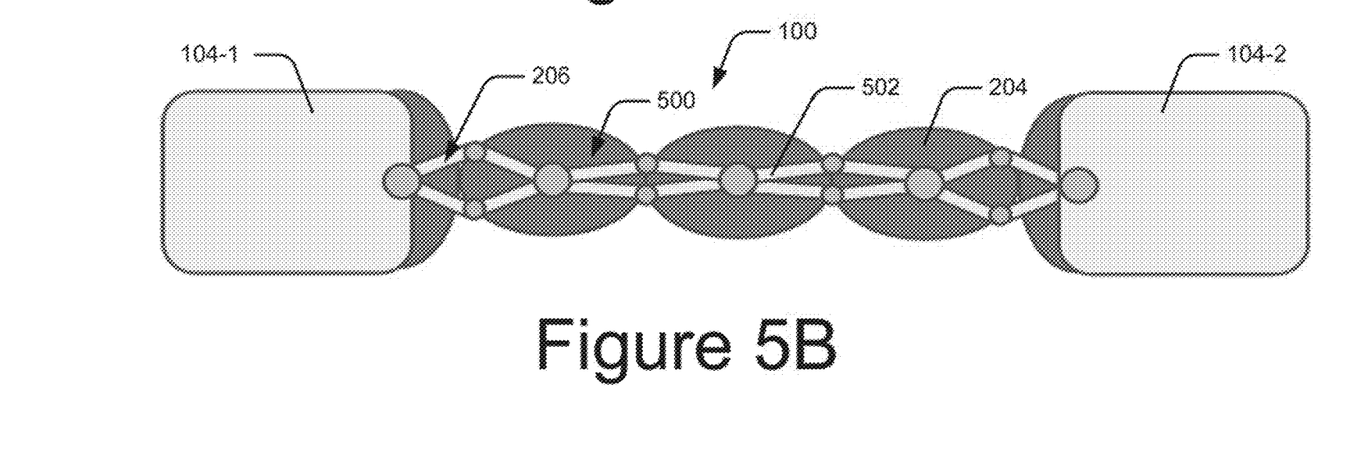

FIG. 5A and FIG. 5B illustrate the hinge 100, in accordance with another example of the present subject matter. Similar to FIG. 4A and FIG. 4B, FIG. 5A illustrates the hinge 100 in the unstretched state of the elastic connector element 206 and FIG. 5B illustrates the stretched state of the elastic connector element 206.

In the example, shown in FIG. 5A and FIG. 58B, the elastic connector element 206 can be formed of sub-elements 500 assembled together. For instance, the sub-elements 500 can be scissor arms 502 connected together to form the elastic connector element 206. One set of the scissor arms 502 can be coupled to an adjacent set of the scissor arms 502 using a biasing member, such as a torsion spring (not shown). In an example, the bias or spring force of the biasing member can facilitate in providing the stiffness to maintain the hinge 100 in the folded or the unfolded position. As shown in FIG. 5B, the scissor arms 502 can extend to form gaps for the oval gears 204 to rotate and align at least substantially along the major axes.

Figure 6A:
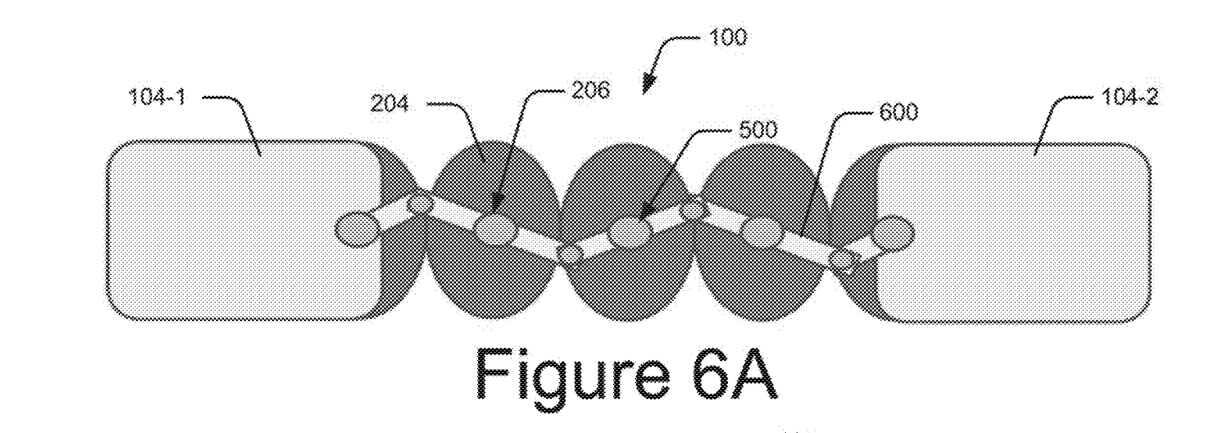
FIGS. 6A and 6B illustrate the hinge, according to yet another example of the present subject matter.
Figure 6B:
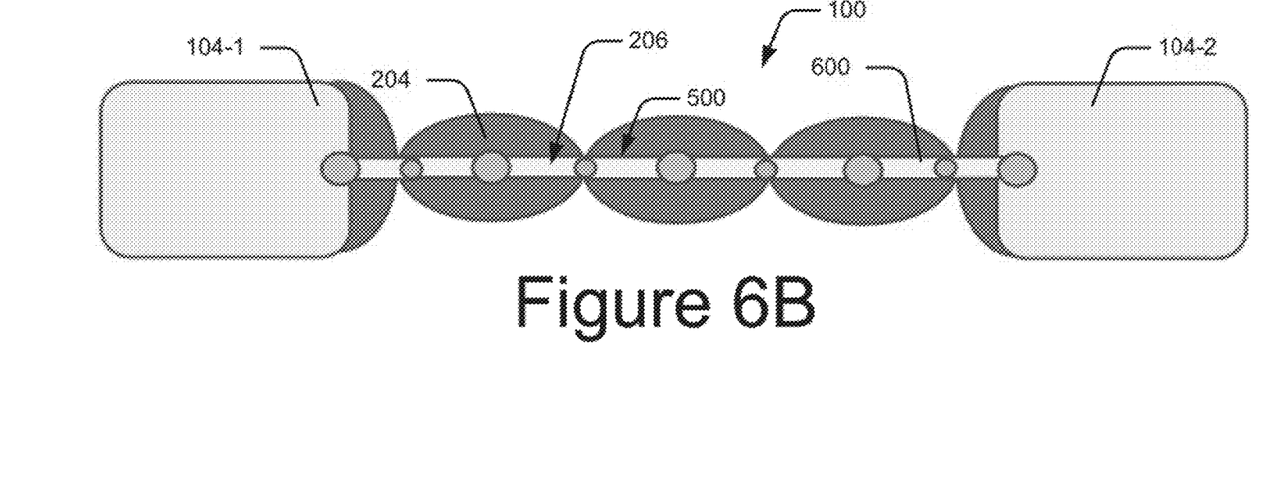

FIG. 6A and FIG. 6B illustrate the hinge 100, in accordance with yet another example of the present subject matter. Similar to FIGS. 4A and 4B and FIGS. 5A and 5B, FIG. 6A illustrates the hinge 100 in the unstretched state of the elastic connector element 206 and FIG. 6B illustrates the elastic connector element 206 in the stretched state.

In said example, as mentioned earlier, the elastic connector element 206 can be formed as an assembly of the sub-elements 500. For instance, as shown in FIG. 5A and FIG. 5B, the elastic connector element 206 can comprise a plurality of links 600, each link connected to the adjacent link through a biasing member, such as the torsion spring. The biasing member can achieve similar functionality as explained above with reference to FIG. 5A and FIG. 5B. In an unfolded condition of the hinge 100, the links 600 can be misaligned and, in the folded condition, i.e., the extended condition of the elastic connector element 206, the links 600 can be at least substantially aligned.

Figure 7A:
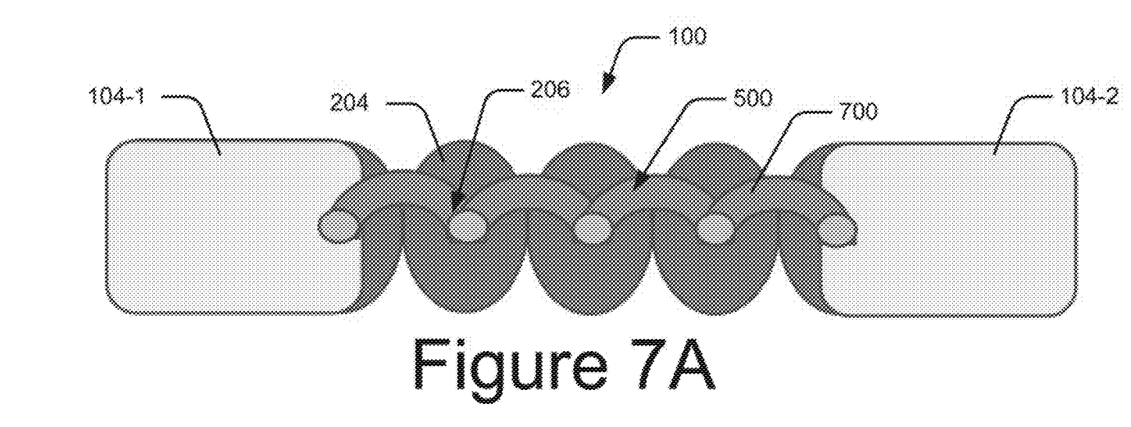
FIGS. 7A and 7B illustrate the hinge, according to one other example of the present subject matter.
Figure 7B:
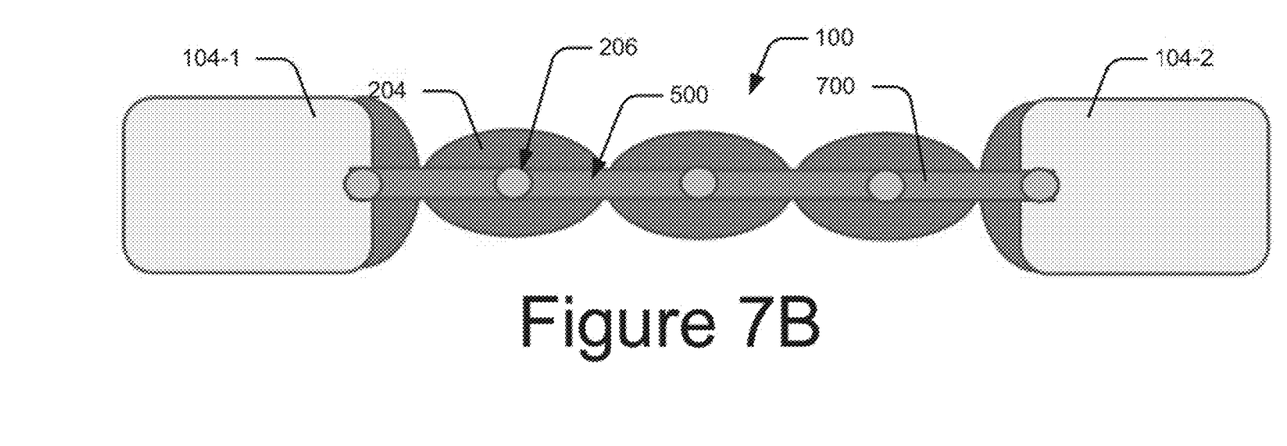

FIG. 7A and FIG. 7B illustrate the hinge 100, in accordance with one other example of the present subject matter.

As shown in FIGS. 4A and 4B, FIGS. 5A and 5B, and FIGS. 6A and 6B, FIG. 7A illustrates the hinge 100 in the unstretched condition of the elastic connector element 206 and FIG. 7B illustrates the hinge 100 in the stretched condition of the elastic connector element 206.

In said example, the elastic connector element 206 can comprise a plurality of elastic links 700 connected together, for instance, glued together. In one case, the elastic links 700 can comprise natural rubber or synthetic rubber, or any other similar elastic material. In the unfolded condition of the hinge 100, the elastic links 700 can be in a retracted state. When the hinge 100 is folded, the elastic links 700 can extend for providing space for the oval gears 204 to rotate.

Figure 8:
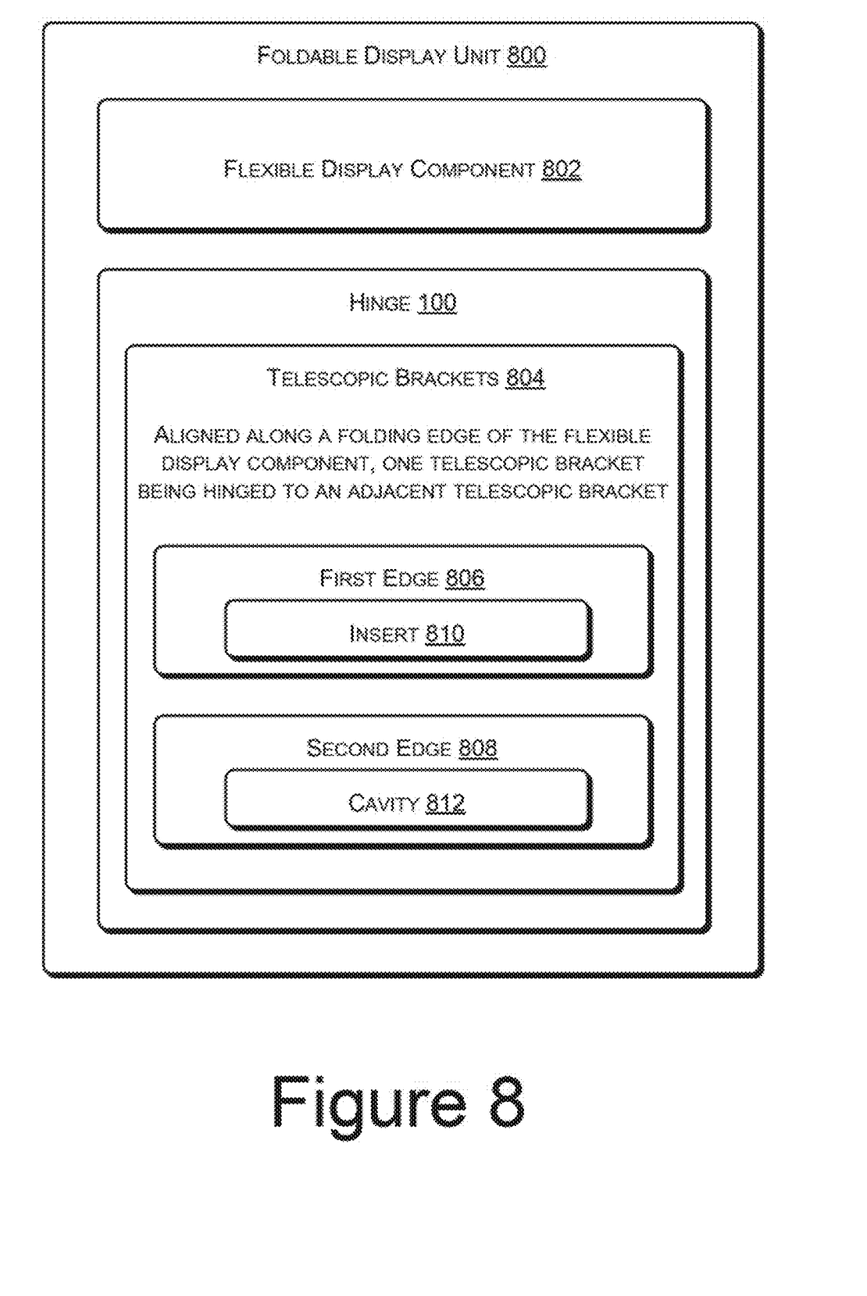
FIG. 8 illustrates a schematic of foldable display unit, according to an example of the present subject matter.

FIG. 8 illustrates a schematic of a foldable display unit 800, in accordance with an example of the present subject. In an example, the foldable component 200 is the foldable display unit 800. For instance, the foldable display unit 800 can be a foldable display assembly for use in an electronic device, such as a smart phone, a tablet personal computer (PC), and a laptop PC, having a flexible display component 802. The flexible display component 802 can be an example of the flexible element 202 and can be a flexible display screen usable for the electronic device. Accordingly, the flexible display component 802 can have the folding edge along which the flexible display component 802 can be folded.

Further, the foldable display unit 800 can include the hinge 100 for supporting the flexible display component 802 and for providing rigidity to the flexible display component 802, for instance, in the folded condition of the flexible display component 802. The hinge 100, as mentioned previously, can include the bracing elements 102.

In the example shown in FIG. 8, the bracing elements 102 can be telescopic brackets 804. Accordingly, in said example, the hinge 100 can include a plurality of telescopic brackets 804 aligned along the folding edge of the flexible display component 802. Each telescopic bracket 804 can have a first edge 806 and a second edge 808, and the first edge 806 can have an insert 810 extending along a central longitudinal axis of the telescopic bracket 804 and the second edge 808 can have a cavity 812 extending along a central longitudinal axis of the telescopic bracket 804.

Further, one telescopic bracket 804 can be hinged to and abut against an adjacent telescopic bracket 804 and the assembly of the telescopic brackets 804 can be folded in an arcuate shape. The first edge 806 of one telescopic bracket 804 can be hinged to the second edge 808 of the adjacent telescopic bracket 804 to abut against the adjacent telescopic bracket 804 in the unfolded state. In addition, the insert 810 of one telescopic bracket 804 can move inside the cavity 812 of the adjacent telescopic bracket 804 when the hinge 100 is folded into the arcuate shape. According to an aspect, the insert 810 can bear an interference fit with the cavity 812.

Figure 9A:
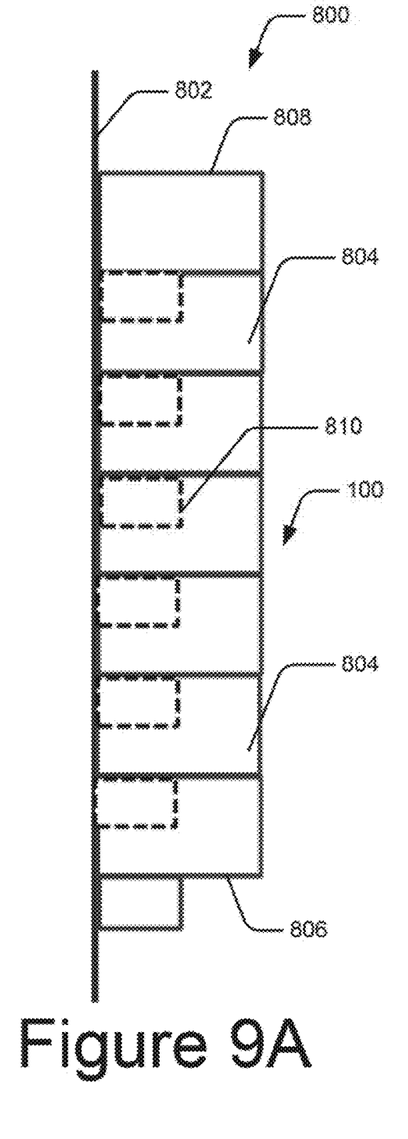
FIGS. 9A and 9B illustrate the foldable display unit of FIG. 8 in an unfolded condition, according to an example of the present subject matter.
Figure 9B:
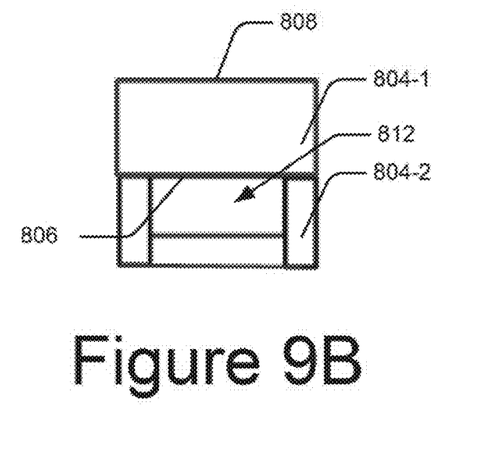

FIG. 9A illustrates the hinge 100 in accordance with the example described with reference to FIG. 8. In FIG. 9A, the hinge 100 is shown in unfolded state. Further, FIG. 9B illustrates adjacent telescopic brackets 804-1 and 804-2 in an assembled state, in the unfolded state of the hinge 100. For the sake of brevity and ease of understanding, FIG. 9A and FIG. 9B are described in conjunction.

As shown, in the unfolded state, the insert 810 of one telescopic bracket 804-1 is substantially inside the cavity 812 of the adjacent telescopic bracket 804, and the first edge 806 of the telescopic bracket 804-1 abuts against the second edge 808 of the adjacent telescopic bracket 804-2.

Further, in addition to as explained above, the hinge 100 as shown in FIG. 8 and FIG. 9A can include end couplers 104. The end couplers 104 can be attached, fixedly or detachably, to the flexible display component 802. For instance, the end coupler 104 can be coupled to the flexible display component 802 using a fastener, such as a nut and bolt, a screw, a rivet, or using an adhesive, or a combination. In another example, the telescopic brackets 804 at the longitudinal ends of the hinge 100 can act as the end couplers 104. In one case, in addition to the end couplers 104, the telescopic brackets 804 can be coupled to the flexible display component 802, in the same manner as described above.

Figures 10A, 10B:
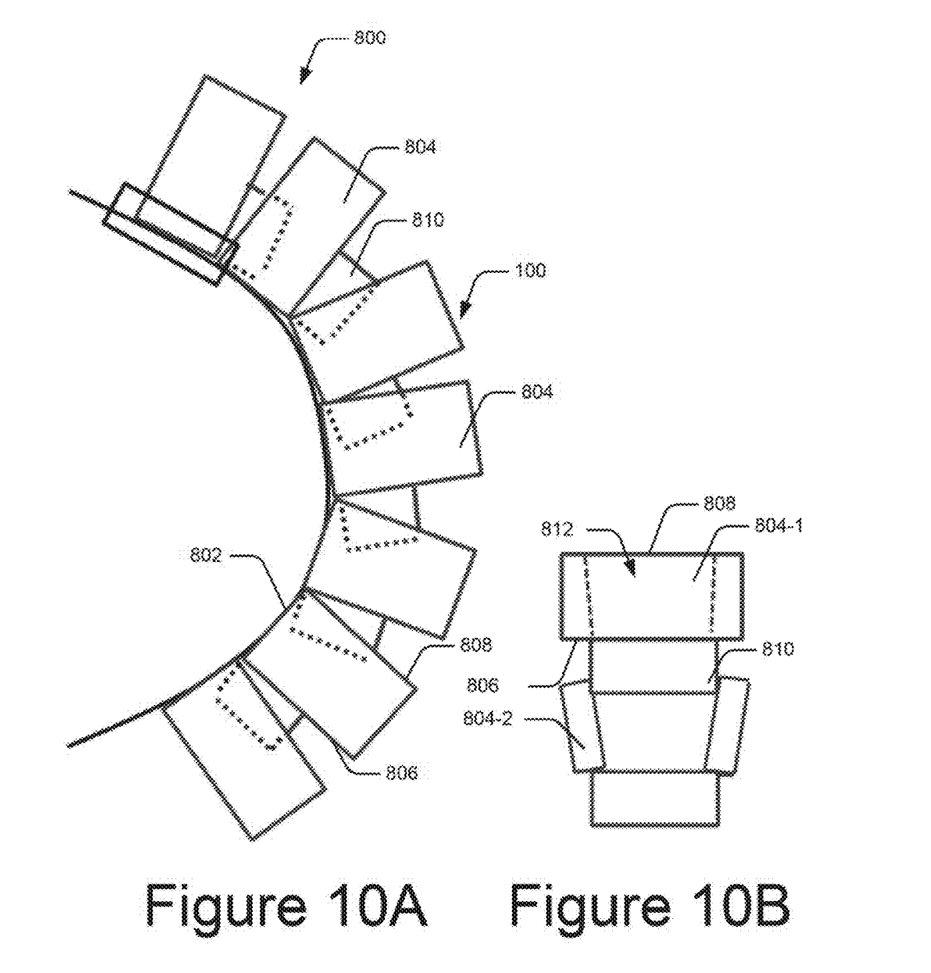
FIGS. 10A and 10B illustrate the foldable display unit of FIG. 8 in a folded condition, according to an example of the present subject matter.

FIG. 10A illustrates the hinge 100 in the folded condition, according to the example explained in FIG. 8. In addition, FIG. 10B illustrates adjacent telescopic brackets 804-1 and 804-2 in the assembled state, in the folded condition of the hinge 100. For the sake of brevity and ease of understanding, FIG. 10A and FIG. 10B are described in conjunction.

As shown, in the folded condition of the hinge 100, the insert 810 of one telescopic bracket 804 can be partly outside the cavity 812 of the adjacent telescopic bracket 804. Therefore, as the hinge 100 is folded, the insert 810 of the telescopic bracket 804 can move inside the cavity 812 of the adjacent telescopic bracket 804. In addition, the hinged connection between the telescopic brackets 804, as shown in FIG. 9A, facilitates the hinge 100 to fold along the curvature of the flexible display component 802 and, at the same time, remain in operable connection to support the flexible display component 802, for instance, in the folded and unfolded condition of the hinge 100.

As shown in FIG. 9B, in an example, the cavity 812 of the one telescopic bracket 804-2 can have a tapered construction in order to provide for the interference fit or press fit with the insert 810 of the adjacent telescopic bracket 804-1. The interference fit between the telescopic brackets 804-1 and 804-2 can provide for a firm support for the flexible display component 802, for instance, in the folded condition of the hinge 100.

In one example, the telescopic brackets 804 can comprise a ceramic material, a polymer, a metal, a metal alloy, or a combination thereof. For instance, the telescopic brackets can comprise Sk7 steel. Further, in an example, an abutting surface of each telescopic bracket 804, i.e., surface at which one telescopic bracket 804-2 comes in contact with the adjacent telescopic bracket 804-1, can be treated with surface hardening processes. For instance, the first edge 806, the second edge 808, the insert 810, and the cavity 812 of each telescopic bracket 804 can be surface treated for hardening. For example, the abutting surfaces of the telescopic brackets 804 can be coated with a hard coating, using techniques, such as physical vapor deposition (PVD), chemical vapor deposition (CVD), and spray coating. For instance, in case the telescopic brackets 804 are comprised of a metal or a metal alloy, the abutting surfaces can be hardened by case hardening.

Although examples for the hinge 100 for a foldable component 200 have been described in language specific to structural features and/or methods, it is to be understood that the appended claims are not limited to the specific features or methods described. Rather, the specific features and methods are disclosed as examples for the hinge 100.

We claim:

1. A hinge comprising:
    a plurality of bracing elements in which each bracing element is to operably couple to an adjacent bracing element to fold into an arcuate shape and is supported and locked against the adjacent bracing element in the arcuate shape, the bracing elements comprising a plurality of oval gears;

an end coupler at each longitudinal end of the hinge to couple the hinge to a flexible element; and an elastic connector element having the end coupler at each longitudinal end, the oval gears being rotatably mounted on the elastic connector element within a length of the elastic connector element, and wherein each of the plurality of oval gears is to abut against adjacent oval gears at a minor axis in an unfolded condition of the hinge.

2. The hinge as claimed in claim 1, wherein each of the plurality of oval gears is to rotate about a fixed axis on the elastic connector element when the hinge is folded.

3. The hinge as claimed in claim 1, wherein an abutting surface of each of a plurality of bracing elements is treated by a surface hardening process.

4. A foldable component comprising:
a flexible element comprising a folding edge, wherein the flexible element is foldable along the folding edge; and
a hinge coupled to the flexible element to support the flexible element during folding, wherein the hinge is to longitudinally extend along the folding edge, the hinge comprising,
an elastic connector element to longitudinally extend along the folding edge, the elastic connector element having an end coupler at each longitudinal end of the elastic connector element to couple to ends of the folding edge of the flexible element; and
a plurality of oval gears rotatably mounted on the elastic connector element within a length of the elastic connector element, wherein each of the plurality of oval gears is to abut against adjacent oval gears along a minor axis in an unfolded condition of the foldable component.

5. The foldable component as claimed in claim 4, wherein each of the plurality of oval gears is to rotate about a fixed axis on the elastic connector element when the foldable component is folded, and wherein the elastic connector element is to bend along the length when the foldable component is folded.

6. The foldable component as claimed in claim 4, wherein each of the plurality of oval gears is to abut at least substantially along a along a major axis in a considerably folded condition of the foldable component.

7. The foldable component as claimed in claim 4, wherein the elastic connector element comprises an assembly of a plurality of sub-elements, one sub-element connected to an adjacent sub-element using a torsion spring.

8. The foldable component as claimed in claim 7, wherein the plurality of sub-elements comprises a plurality of scissor arms.

9. The foldable component as claimed in claim 4, wherein the elastic connector element comprises an assembly of a plurality of extendible elastic components.

10. The foldable component as claimed in claim 4, wherein the elastic connector element comprises one of a polymer, a ceramic material, natural rubber, and a combination thereof.

11. The foldable component as claimed in claim 4, wherein the polymer is one of a silicon-based polymer, a cellulose-based polymer, a polycarbonate (PC), a polyester (PET), a polyethersulfone (PES), a polyimide (PI), a polynorbornene, a polyarylate, a polyurethane, a liquid-crystal polymer, an elastomer, and a combination thereof.

12. The foldable component 4, wherein the elastic connector element comprises a plurality of sub-elements, each sub-element except a first sub-element and a last sub-element connecting an adjacent pair of the oval gears to one another.

13. A foldable display unit comprising:
a flexible display component comprising a folding edge, wherein the flexible display component is foldable along the folding edge; and
a hinge coupled to the flexible display component to support the flexible display component during folding, the hinge comprising:
a plurality of bracing elements in which each bracing element is to operably couple to an adjacent bracing element to fold into an arcuate shape and is supported and locked against the adjacent bracing element in the arcuate shape, the bracing elements comprising a plurality of oval gears;
an end coupler at each longitudinal end of the hinge to couple the hinge to a flexible element; and
an elastic connector element having the end coupler at each longitudinal end, the oval gears being rotatably mounted on the elastic connector element within a length of the elastic connector element, and wherein each of the plurality of oval gears is to abut against adjacent oval gears at a minor axis in an unfolded condition of the hinge.

14. The foldable display unit as claimed in claim 13, wherein the first edge of the one telescopic bracket is to abut against the second edge of the adjacent telescopic bracket in the unfolded state of the hinge.

* * * * *

UNITED STATES PATENT AND TRADEMARK OFFICE
CERTIFICATE OF CORRECTION

PATENT NO. : 10,234,905 B2
APPLICATION NO. : 15/563967
DATED : March 19, 2019
INVENTOR(S) : Wei-Chung Chen et al.

It is certified that error appears in the above-identified patent and that said Letters Patent is hereby corrected as shown below:

In the Claims

In Column 9, Line 45, Claim 6, after "along a" delete "along a".

In Column 10, Line 17 (approx.), Claim 12, after "component" insert -- as claimed in claim --.

Signed and Sealed this
Twenty-seventh Day of August, 2019

Andrei Iancu
*Director of the United States Patent and Trademark Office*